United States Patent
Kopp et al.

(10) Patent No.: US 10,043,949 B2
(45) Date of Patent: Aug. 7, 2018

(54) OPTOELECTRONIC SEMICONDUCTOR CHIP

(71) Applicant: OSRAM Opto Semiconductors GmbH, Regensburg (DE)

(72) Inventors: Fabian Kopp, Tanjung Tokong Penang (MY); Christian Eichinger, Wenzenbach (DE); Korbinian Perzlmaier, Regensburg (DE)

(73) Assignee: OSRAM OPTO Semiconductors GmbH, Regensburg (DE)

(*) Notice: Subject to any disclaimer, the term of this patent is extended or adjusted under 35 U.S.C. 154(b) by 0 days.

(21) Appl. No.: 15/522,783

(22) PCT Filed: Oct. 20, 2015

(86) PCT No.: PCT/EP2015/074258
§ 371 (c)(1),
(2) Date: Apr. 28, 2017

(87) PCT Pub. No.: WO2016/066477
PCT Pub. Date: May 6, 2016

(65) Prior Publication Data
US 2017/0324005 A1    Nov. 9, 2017

(30) Foreign Application Priority Data

Oct. 29, 2014  (DE) .................. 10 2014 115 740

(51) Int. Cl.
*H01L 33/00*    (2010.01)
*H01L 33/42*    (2010.01)
(Continued)

(52) U.S. Cl.
CPC .............. *H01L 33/42* (2013.01); *H01L 33/10* (2013.01); *H01L 33/24* (2013.01); *H01L 33/325* (2013.01); *H01L 33/38* (2013.01)

(58) Field of Classification Search
CPC ......... H01L 33/42; H01L 33/10; H01L 33/24; H01L 33/325; H01L 33/38
See application file for complete search history.

(56) References Cited

U.S. PATENT DOCUMENTS 8,987,772 B2 * 3/2015 Kim ..................... H01L 33/38
257/98
2008/0303034 A1    12/2008 Huang et al.
(Continued)

FOREIGN PATENT DOCUMENTS

DE    102007057672 A1    6/2009
DE    102008032318 A1    10/2009
(Continued)

OTHER PUBLICATIONS https://refractiveindex.info/?shelf=main&book=SiO2&page=Malitson; undated.*
(Continued)

*Primary Examiner* — Nikolay Yushin
(74) *Attorney, Agent, or Firm* — Viering, Jentschura & Partner MBB

(57) ABSTRACT

According to the present disclosure, optoelectronic semiconductor chip includes at least one n-doped semiconductor layer, at least one p-doped semiconductor layer and one active layer arranged between the at least one n-doped semiconductor layer and the at least one p-doped semiconductor layer. The p-doped semiconductor layer is electrically contacted by means of a first metallic connection layer, and a reflection-enhancing dielectric layer sequence is arranged between the p-doped semiconductor layer and the first connection layer, which dielectric layer sequence includes a plurality of dielectric layers with different refractive indices.

17 Claims, 7 Drawing Sheets

(51) Int. Cl.
  *H01L 33/10* (2010.01)
  *H01L 33/38* (2010.01)
  *H01L 33/24* (2010.01)
  *H01L 33/32* (2010.01)

(56) References Cited

U.S. PATENT DOCUMENTS

| | | | |
|---|---|---|---|
| 2009/0283787 | A1 | 11/2009 | Donofrio et al. |
| 2011/0049555 | A1 | 3/2011 | Engl et al. |
| 2011/0316028 | A1 | 12/2011 | Strassburg et al. |
| 2012/0098009 | A1 | 4/2012 | Kim et al. |
| 2012/0181561 | A1 | 7/2012 | Fujimori et al. |
| 2013/0234192 | A1* | 9/2013 | Kim .................. H01L 33/38 257/98 |
| 2014/0124730 | A1 | 5/2014 | Choi et al. |
| 2014/0159089 | A1 | 6/2014 | Lee et al. |
| 2014/0217439 | A1 | 8/2014 | Jeon et al. |
| 2016/0005923 | A1 | 1/2016 | Suzuki et al. |

FOREIGN PATENT DOCUMENTS

| | | |
|---|---|---|
| DE | 102008052405 A1 | 4/2010 |
| DE | 112011103819 T5 | 8/2013 |
| EP | 2743997 A2 | 6/2014 |
| JP | 2006120913 A | 5/2006 |
| JP | 2007258276 A | 10/2007 |
| JP | 2011517064 A | 5/2011 |
| JP | 2011138820 A | 7/2011 |
| JP | 2012506624 A | 3/2012 |
| JP | 2012124306 A | 6/2012 |
| JP | 2012146926 A | 8/2012 |
| JP | 2012527116 A | 11/2012 |
| JP | 2013058608 A | 3/2013 |
| JP | 2014500624 A | 1/2014 |
| JP | 2014093532 A | 5/2014 |
| JP | 2014120776 A | 6/2014 |
| WO | 2012067311 A1 | 5/2012 |
| WO | 2014126016 A1 | 8/2014 |

OTHER PUBLICATIONS https://refractiveindex.info/?shelf=main&book=TiO2&page=Devore-o; undated.*
https://refractiveindex.info/?shelf=main&book=Nb2O5&page=Lemarchand; undated.*
https://www.rp-photonics.com/bragg_mirrors.html ; undated.*
German Search Report based on application No. 10 2014 115 740.0 (6 Pages) dated Jun. 23, 2015 (for reference purpose only).
International Search Report based on application No. PCT/EP2015/074258 (6 pages + 3 pages English translation) dated Jan. 13, 2016.
Japanese Office Action based on U.S. Appl. No. 15/522,783 (3 pages) dated May 7, 2018.

* cited by examiner

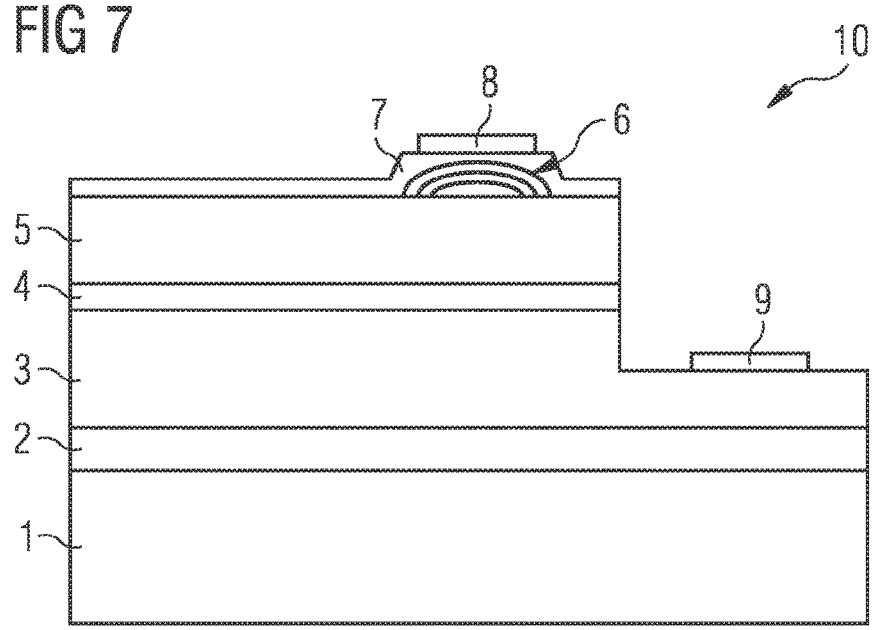
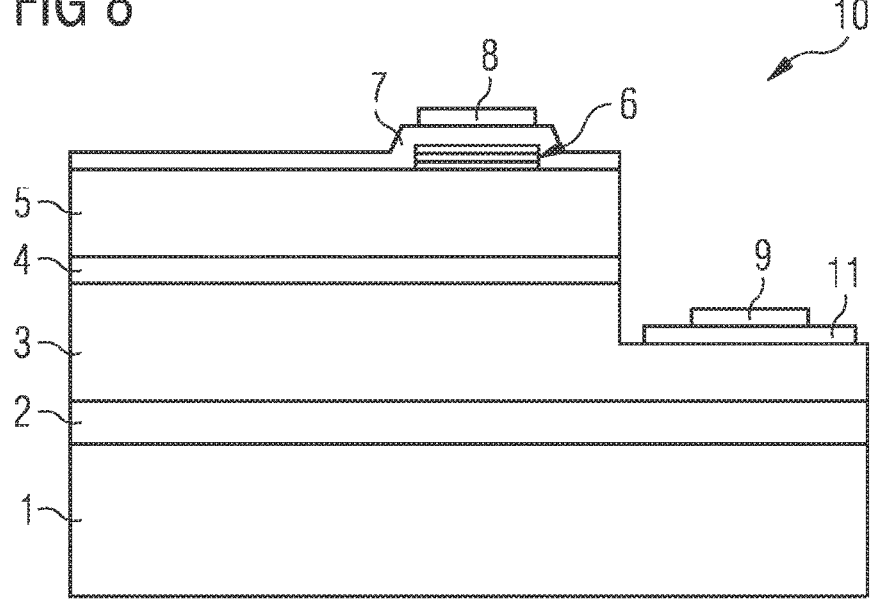

OPTOELECTRONIC SEMICONDUCTOR CHIP

RELATED APPLICATIONS

The present application is a national stage entry according to 35 U.S.C. § 371 of PCT application No.: PCT/EP2015/074258 filed on Oct. 20, 2015, which claims priority from German application No.: 10 2014 115 740.0 filed on Oct. 29, 2014, and is incorporated herein by reference in its entirety.

TECHNICAL FIELD

The present disclosure relates to an optoelectronic semiconductor chip, in particular a radiation-emitting optoelectronic semiconductor chip such as for example an LED chip.

BACKGROUND

In the case of optoelectronic semiconductor chips such as for example LED chips, as a rule metallic connection layers are applied to the semiconductor layers for the purpose of electrical contacting. However, since metals have a high absorbance coefficient, some of the emitted radiation is absorbed in the metallic connection layer.

SUMMARY

The object underlying the present disclosure is that of providing an improved optoelectronic semiconductor chip with at least one metallic connection layer in which absorption losses in the metallic connection layer are reduced.

This object is achieved by an optoelectronic semiconductor chip according to independent claim 1. Advantageous configurations and further developments of the present disclosure are the subject matter of the dependent claims.

According to at least one embodiment, the optoelectronic semiconductor chip includes at least one n-doped semiconductor layer, at least one p-doped semiconductor layer and an active layer arranged between the n-doped semiconductor layer and the p-doped semiconductor layer. The active layer is in particular a layer suitable for emitting radiation. The optoelectronic semiconductor chip may in particular be an LED chip.

The p-doped semiconductor layer is electrically contacted by means of a first metallic connection layer. In other words, the first metallic connection layer forms the p-contact of the optoelectronic semiconductor chip. The first metallic connection layer may in particular be arranged on the radiation exit face of the optoelectronic semiconductor chip. The first metallic connection layer may for example include a bond pad and/or one or more contact webs.

In the optoelectronic semiconductor chip, a reflection-enhancing dielectric layer sequence is advantageously arranged between the p-doped semiconductor layer and the first metallic connection layer, which dielectric layer sequence includes a plurality of dielectric layers with different refractive indices. Radiation emitted from the active layer in the direction of the first metallic connection layer is advantageously reflected back at least in part by the reflection-enhancing dielectric layer sequence before it impinges on the first metallic connection layer, so reducing absorption losses. Because the reflection-enhancing dielectric layer sequence is electrically insulating, it has the further effect of reducing current flow through a region of the semiconductor layer sequence which is arranged under the metallic connection layer and adjoins the reflection-enhancing dielectric layer sequence. Therefore, less radiation is generated in the region of the active layer which is arranged beneath the metallic connection layer than in regions in which the semiconductor layer sequence is not covered by the reflection-enhancing dielectric layer sequence. The efficiency of the optoelectronic semiconductor chip is thereby increased advantageously.

In one advantageous configuration, a transparent electrically conductive layer is arranged between the first connection layer and the p-doped semiconductor layer. In particular, the first connection layer and the p-doped semiconductor layer are connected together electrically conductively by means of the transparent electrically conductive layer. The transparent electrically conductive layer is arranged for example at least in places between the dielectric layer sequence and the first connection layer and extends in the lateral direction next to the dielectric layer sequence over the p-doped semiconductor layer. In this way, the first connection layer is connected to the p-doped semiconductor layer without directly adjoining the p-doped semiconductor layer. In this way, the transparent electrically conductive layer advantageously enables arrangement of the electrically insulating dielectric layer sequence between the p-doped semiconductor layer and the first connection layer.

Because the transparent electrically conductive layer is transmissive to the emitted radiation, it may cover a comparatively large proportion of the p-doped semiconductor layer outside the dielectric layer sequence. Advantageously, the transparent electrically conductive layer covers the majority of the p-doped semiconductor layer or is even applied over the entire surface of the p-doped semiconductor layer apart from the region of the dielectric layer sequence. This results in good current spreading in the semiconductor layer sequence. The transparent electrically conductive layer advantageously contains a transparent conductive oxide (TCO) such as for example ITO.

In a further advantageous configuration, a transparent electrically conductive interlayer is arranged between the p-doped semiconductor layer and the reflection-enhancing dielectric layer sequence. The transparent electrically conductive interlayer advantageously covers the entire surface of the p-doped semiconductor layer. The transparent electrically conductive interlayer may be provided in addition or as an alternative to the above-mentioned transparent electrically conductive layer which advantageously covers the dielectric layer sequence at least in part. It is for example possible for the transparent electrically conductive layer to encase the reflection-enhancing dielectric layer sequence such that it in part adjoins the transparent electrically conductive interlayer laterally next to the reflection-enhancing layer sequence. In this way, an electrically conductive connection is formed between the first connection layer and the transparent electrically conductive interlayer.

Alternatively, provision may be made for the first connection layer to encase the reflection-enhancing dielectric layer sequence. In the configuration, the first connection layer may in part adjoin the transparent electrically conductive interlayer laterally next to the reflection-enhancing layer sequence and in this way bring about electrical contact with the transparent electrically conductive interlayer.

According to at least one advantageous configuration, the reflection-enhancing dielectric layer sequence includes at least three dielectric layers, which include at least one first dielectric layer of a first dielectric material with a refractive index n1 and at least one second dielectric layer of a second dielectric material with a refractive index n2>n1. The first dielectric material advantageously has a low refractive index, advantageously $n1 \leq 1.7$, and the second dielectric material a high refractive index $n2 > 1.7$, advantageously $n2 > 2$. The dielectric layer sequence functions as an interference layer system, the reflection-enhancing effect of which is based on multiple reflections at the interfaces between the dielectric layers with the different refractive indices $n1$, $n2$.

The dielectric layer sequence advantageously includes at least two layers of the first dielectric material and/or the second dielectric material. For example, the dielectric layer sequence may include a first layer of the first dielectric material with the low refractive index $n1$, a second layer of the second dielectric material with the high refractive index $n2$ and a third layer of the first dielectric material with the low refractive index $n1$.

The reflection-enhancing dielectric layer sequence may include a plurality of alternating layers of the first dielectric material and the second dielectric material. The dielectric layer sequence for example includes a plurality of layer pairs, which each include a first dielectric layer with a refractive index $n1$ and a second dielectric layer with a refractive index $n2 > n1$. In this case, the reflection-enhancing dielectric layer sequence is formed from alternating layers with alternately low and high refractive indices. The reflection-enhancing dielectric layer sequence may in particular be a periodic layer sequence which includes a plurality of identical pairs of layers consisting in each case of the first dielectric layer and the second dielectric layer.

The layer thicknesses of the dielectric layers in the dielectric layer sequence are advantageously optimized in that the dielectric layer sequence has maximally high reflection in the region of the emission spectrum of the active layer, in particular at the dominant wavelength and the dominant angle of the emitted radiation. According to at least one advantageous configuration, the active layer is suitable for emission of radiation with a dominant wavelength $\lambda$, wherein $0.01\,\lambda/4 \leq n1*d1 \leq 10\,\lambda/4$ applies for the thickness $d1$ of the at least one first dielectric layer and $0.01\,\lambda/4 \leq n2*d2 \leq 10\,\lambda/4$ applies for the thickness $d2$ of the at least one second dielectric layer. Advantageously, $0.5\,\lambda/4 \leq n1*d1 \leq 5\,\lambda/4$ and $0.5\,\lambda/4 \leq n2*d2 \leq 5\,\lambda/4$ apply.

In one preferred configuration, $0.7\,\lambda/4 \leq n1*d1 \leq 1.3\,\lambda/4$ applies for the thickness of the at least one first dielectric layer and $0.7\,\lambda/4 \leq n2*d2 \leq 1.3\,\lambda/4$ applies for the thickness of the at least one second dielectric layer. In this case the optical thickness $n1*d1$ of the first dielectric layer and the optical thickness $n1*d1$ of the second dielectric layer are approximately equal to a quarter of the dominant wavelength. This is a possible way of achieving high reflection through interference in the dielectric layer sequence. The reflection-enhancing dielectric layer sequence may take the form in particular of a DBR (Distributed Bragg Reflector) mirror. A DBR mirror contains a periodic sequence of pairs of layers, which each include a first dielectric layer with a refractive index $n1$ and a second dielectric layer with a refractive index $n2 > n1$.

According to one advantageous configuration, the reflection-enhancing dielectric layer sequence contains at least one of the materials $Al_2O_3$, $Ta_2O_5$, $ZrO_2$, $ZnO$, $SiN_x$, $SiO_xN_y$, $SiO_2$, $TiO_2$, $ZrO_2$, $HfO_2$, $Nd_2O_5$ or $MgF_2$ or consists thereof. The reflection-enhancing dielectric layer sequence may for example be deposited by atomic layer deposition (ALD) or by a CVD method, in particular PECVD (Plasma Enhanced Chemical Vapor Deposition). In this method, the reflection-enhancing dielectric layer sequence is advantageously applied firstly over the entire surface of the p-doped semiconductor layer and then patterned by an etching process using a resist mask as etching mask.

Alternatively, the reflection-enhancing dielectric layer sequence may be applied for example by sputtering or by vapor deposition. In this case, the patterning may proceed for example using a lift-off method, in which the reflection-enhancing dielectric layer sequence is deposited in a window in a mask layer and the material deposited onto the mask layer is lifted off again with the mask layer.

According to one advantageous configuration, the at least one n-doped semiconductor layer is electrically connected by means of a second metallic connection layer. In this case, a second transparent electrically conductive layer is advantageously arranged between the n-doped semiconductor layer and the second metallic connection layer. The second connection layer is in this case electrically connected to the semiconductor material of the n-doped semiconductor layer advantageously not via a direct metal semiconductor contact, but rather via the second transparent electrically conductive layer. This counteracts the formation of a Schottky barrier, which arises in particular in the case of metals with a high work function such as for example Au, Rh, Pt or Pd on an n-doped nitride compound semiconductor material and leads to an increase in operating voltage.

Like the transparent electrically conductive layer advantageously arranged between the p-doped semiconductor layer and the first connection layer, the second transparent electrically conductive layer between the n-doped semiconductor layer and the second metallic connection layer advantageously contains a transparent conductive oxide such as for example ITO. This has the advantage that the contact resistance between the metal of the second connection layer and the transparent conductive oxide such as in particular ITO is advantageously negligibly small. Since the transparent conductive layer brings about current spreading over the n-doped semiconductor layer, the lateral extent of the second metallic connection layer, which takes the form for example of a bond pad and/or a contact web, may be kept comparatively small. This reduces possible absorption in the second metallic connection layer.

In a further advantageous configuration, a second reflection-enhancing dielectric layer sequence including a plurality of dielectric layers with different refractive indices is arranged between the n-doped semiconductor layer and the second metallic connection layer. The second reflection-enhancing dielectric layer sequence advantageously reflects radiation propagating in the direction of the second metallic connection layer back into the semiconductor body, thereby advantageously reducing the absorption in the second metallic connection layer. The second reflection-enhancing dielectric layer sequence between the n-doped semiconductor layer and the second metallic connection layer may have the same advantageous configurations as the previously described reflection-enhancing dielectric layer sequence between the p-doped semiconductor layer and the first metallic connection layer. These advantageous configurations will not therefore be explained again in greater detail.

In one configuration, provision may be made for the second connection layer to encase the second reflection-enhancing dielectric layer sequence. In the configuration, the second connection layer may in part adjoin the n-doped semiconductor layer laterally next to the reflection-enhancing layer sequence and in this way form an electrical contact with the n-doped semiconductor layer. It is alternatively also possible to arrange a second transparent electrically conductive interlayer between the n-doped semiconductor layer and the second reflection-enhancing dielectric layer sequence. In this case, the second connection layer may at least in part adjoin the second electrically conductive interlayer, if it encases the reflection-enhancing dielectric layer sequence.

In one preferred configuration, the first metallic connection layer and/or the second metallic connection layer include at least one of the metals Au, Ag, Ti, Pt, Pd, Cu, Ni, In, Rh, W, Cr or Al. The first and/or the second metallic connection layers may be deposited for example by vapor deposition or sputtering.

Particularly advantageously, the first metallic connection layer includes Au, Cu, Ti or an alloy with at least one of these metals such as for example Au/Cu. Due to the arrangement of the reflection-enhancing dielectric layer sequence between the p-doped semiconductor layer and the first metallic connection layer, the reflection coefficient of the first metallic connection layer does not have any significant influence on the brightness of the semiconductor chip. Metals may therefore advantageously be selected for the first metallic connection layer which are distinguished not by a particularly high reflection coefficient but rather by advantageous electrical and/or thermal properties such as for example low electromigration and/or high electrical and thermal conductivity, such as in particular Au, Cu, Au/Cu or Ti.

In a further advantageous configuration, the second metallic connection layer includes silver. The first metallic connection layer advantageously does not include any silver. Silver is a metal which is distinguished by high electrical conductivity and particularly high reflection in the visible region of the spectrum. These properties may advantageously be utilized in particular in the second metallic connection layer, which contacts the n-doped semiconductor layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
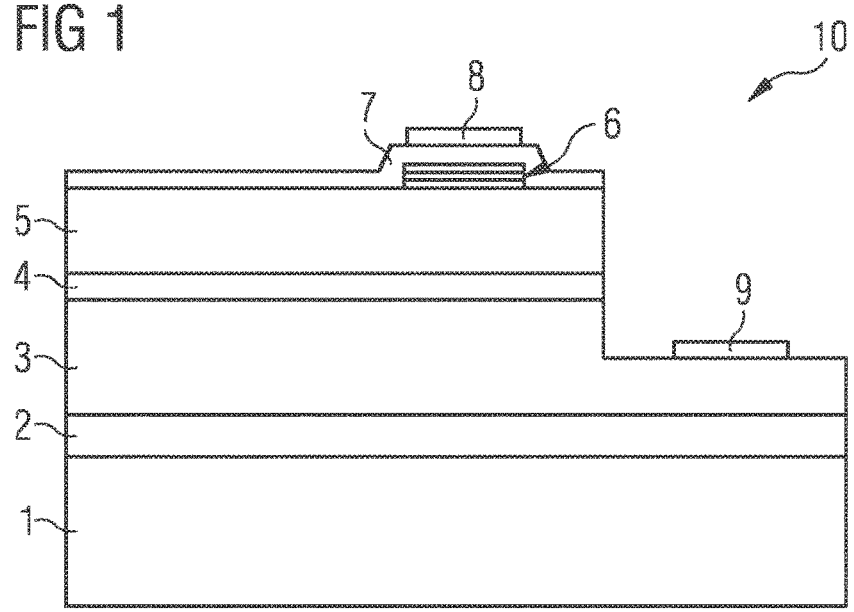
FIG. 1 is a schematic representation of a cross-section through an optoelectronic semiconductor chip according to one embodiment.

FIG. 1 shows an optoelectronic semiconductor chip 10 according to a first embodiment. The optoelectronic semiconductor chip 10 includes a semiconductor layer sequence 2, 3, 4, 5 applied to a substrate 1. At least one buffer layer 2 may for example be applied to the substrate 1, said buffer layer being followed by at least one n-doped semiconductor layer 3, an active layer 4 and at least one p-doped semiconductor layer 5. To simplify the depiction, FIG. 1 shows just one n-doped semiconductor layer 3 and one p-doped semiconductor layer 5, wherein the active layer 4 may however obviously also be surrounded by a plurality of n-doped layers or p-doped layers.

The semiconductor layer sequence 2, 3, 4, 5 may be based in particular on a nitride compound semiconductor. "Based on a nitride compound semiconductor" means in the present context that the semiconductor layer sequence or at least one layer thereof includes a III-nitride compound semiconductor material, advantageously $In_xAl_yGa_{1-x-y}N$, wherein $0 \leq x \leq 1$, $0 \leq y \leq 1$ and $x+y \leq 1$ This material does not absolutely have to exhibit a mathematically exact composition according to the above formula. Instead, it may include one or more dopants and additional constituents which do not substantially modify the characteristic physical properties of the $In_xAl_yGa_{1-x-y}N$ material. For simplicity's sake, however, the above formula includes only the fundamental constituents of the crystal lattice (In, Al, Ga, N), even if these may in part be replaced by small quantities of further substances.

The substrate 1 is advantageously a substrate suitable for growing a nitride compound semiconductor material. In particular, the substrate 1 may be a sapphire substrate. Alternatively, the substrate may for example include Si, SiC or GaN.

The active layer 4 may in particular be a radiation-emitting active layer. The active layer may for example take the form of a pn-junction, of a double heterostructure, of a single quantum well structure or of a multiple quantum well structure. The term "quantum well structure" here includes any structure in which charge carriers undergo quantization of their energy states by inclusion ("confinement"). In particular, the term quantum well structure does not provide any indication of the dimensionality of the quantization. It thus encompasses inter alia quantum troughs, quantum wires and quantum dots and any combination of these structures.

In the optoelectronic semiconductor chip 10, a first electrical connection layer 8 is provided for electrical contacting of the at least one p-doped semiconductor layer 5. Furthermore, the optoelectronic semiconductor chip 10 includes a second electrical connection layer 9 for electrical contacting of the at least one n-doped semiconductor layer 3. The first electrical connection layer 8 and the second electrical connection layer 9 are each metallic layers which include at least one metal or at least one metal alloy. It is also possible for the first electrical connection layer 8 and/or the second electrical connection layer 9 to include a plurality of sublayers of different metals or metal alloys.

The first electrical connection layer 8 and/or the second electrical connection layer 9 may for example include at least one of the metals Au, Ag, Ti, Pt, Pd, Cu, Ni, In, Rh, Cr, Al, or W. These metals may for example be deposited by vapor deposition or sputtering.

The first electrical connection layer 8 advantageously does not directly adjoin the p-doped semiconductor layer 5. Instead, the first electrical connection layer 8 is electrically conductively connected by a transparent electrically conductive layer 7 to the p-doped semiconductor layer 5. As a result of the transparency thereof to the radiation emitted by the active layer 4, the transparent electrically conductive layer 7 may advantageously cover a large region of the surface of the p-doped semiconductor layer 5 and in this way bring about good current spreading in the semiconductor layer sequence. The transparent electrically conductive layer advantageously covers at least half of the surface of the p-doped semiconductor layer 5.

A reflection-enhancing dielectric layer sequence 6 is advantageously arranged between the p-doped semiconductor layer 5 and the first electrical connection layer 8. The lateral extent of the reflection-enhancing dielectric layer sequence 6 is advantageously substantially equal to the lateral extent of the first connection layer 8 or slightly larger. The lateral extent of the reflection-enhancing dielectric layer sequence 6 is advantageously at most 20 µm or advantageously at most 10 µm greater than the lateral extent of the first connection layer 8.

In a method for producing the optoelectronic semiconductor chip 10, the reflection-enhancing dielectric layer sequence 6 may initially be applied over the entire surface of the p-doped semiconductor layer 5 and then patterned photolithographically in conjunction with an etching process. This results in substantially perpendicular side flanks of the reflection-enhancing dielectric layer sequence 6, which are defined by the etching process.

A proportion, propagating in the direction of the first electrical connection layer 8, of the radiation emitted by the active layer 4 is advantageously reflected back by the reflection-enhancing dielectric layer sequence 6 before this proportion of the radiation impinges on the metallic first electrical connection layer 8. The absorption of radiation in the first electrical connection layer 8 is thereby advantageously reduced. Furthermore, the dielectric reflection-enhancing layer sequence 6 has the advantage that it insulates the part of the semiconductor layer sequence arranged directly beneath the first electrical connection layer 8 electrically from the transparent electrically conductive layer 7 and in this way reduces current injection into the region under the first electrical connection layer 8. This has the advantage that, in a region of the active layer 4 which is arranged directly beneath the first electrical connection layer 8, less radiation is emitted which might possibly be absorbed in the region of the first electrical contact layer 8.

The transparent electrically conductive layer 7 is arranged in part between the reflection-enhancing dielectric layer sequence 6 and the first electrical connection layer 8 and in this way is electrically conductively connected both with the first electrical connection layer 8 and with the p-doped semiconductor layer 5.

Figure 2A:
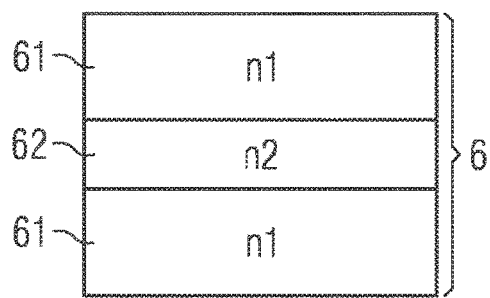
FIGS. 2A and 2B are schematic representations of embodiments of the reflection-enhancing dielectric layer sequence.

FIG. 2A shows an embodiment of the reflection-enhancing dielectric layer sequence 6. In the embodiment, the reflection-enhancing dielectric layer sequence 6 contains a first dielectric layer 61 of a first dielectric material with a refractive index n1, a subsequent second dielectric layer 62 of a second dielectric material with a higher refractive index n2>n1 and a further dielectric layer 61 of the first dielectric material with the refractive index n1. The first dielectric material advantageously has a low refractive index, advantageously n1≤1.7. The second dielectric material advantageously has a high refractive index, advantageously n2>1.7, particularly advantageously n2>2.

Figure 2B:
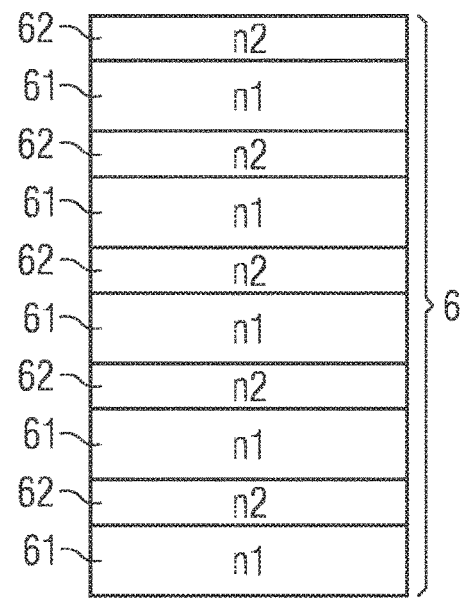

FIG. 2B shows a further embodiment of the reflection-enhancing dielectric layer sequence 6, wherein the reflection-enhancing dielectric layer sequence 6 includes a plurality of pairs of layers which each include a first layer 61 of the first dielectric material with the refractive index n1 and a second layer 62 of the second dielectric material with the higher refractive index n2>n1.

Figure 3A:
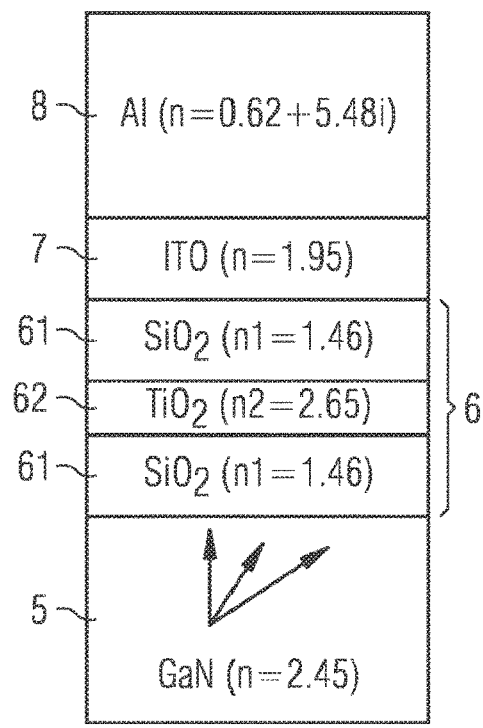
FIGS. 3A and 3B are schematic representations of an embodiment of the reflection-enhancing dielectric layer sequence and of a comparative example with an Al connection layer.

FIG. 3A shows an embodiment of the layer sequence of the p-doped semiconductor layer 5, the reflection-enhancing dielectric layer sequence 6, the transparent electrically conductive layer 7 and the first electrical connection layer 8. In the embodiment, the p-doped semiconductor layer 5 is a GaN layer with a refractive index n≈2.45. The refractive index is stated here and hereinafter in each case for the wavelength λ=450 nm. The reflection-enhancing dielectric layer sequence 6 applied to the p-doped semiconductor layer 5 is formed in the embodiment of three dielectric layers, including a first dielectric layer 61 of $SiO_2$ with a low refractive index n1≈1.46, a second dielectric layer 62 of $TiO_2$ with a high refractive index n2≈2.65 and a further dielectric layer 61 of $SiO_2$ with the low refractive index n1≈1.46. In the growth direction the dielectric layer sequence 6 is followed by the transparent electrically conductive layer 7, which in the embodiment is a layer of ITO with the refractive index n≈1.95, and the metallic first electrical connection layer 8, which is for example an aluminum layer with the complex refractive index n≈0.63+ 5.48 i.

The dielectric layer sequence 6 functions as an interference layer system, wherein the layer thicknesses of the individual layers 61, 62 are advantageously optimized such that the highest possible reflection arises at the dominant wavelength λ of the radiation emitted by the active layer 4. For example, the thickness of the first dielectric layer 61 of $SiO_2$ amounts to d1=100 nm, the thickness of the second dielectric layer 62 of $TiO_2$ to d2=50 nm and the thickness of the third dielectric layer 63 of $SiO_2$ to d3=100 nm.

Figure 3B:
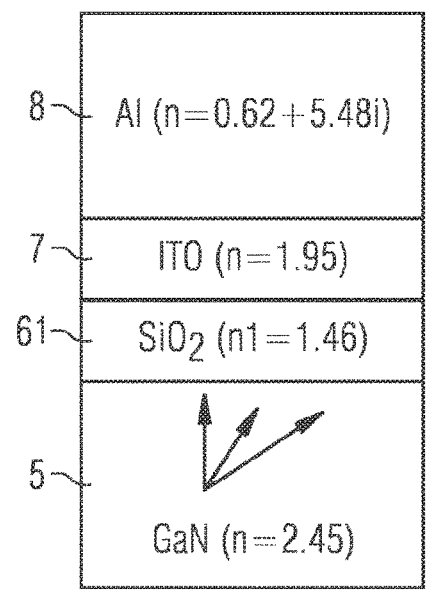

For the purposes of comparison FIG. 3B shows a layer sequence not according to the present disclosure, in which only a single dielectric layer 61 of SiO2 with a thickness d1=100 nm is arranged between the p-doped semiconductor layer 5 and the transparent electrically conductive layer 7 and the metallic first connection layer 8.

Figure 4:
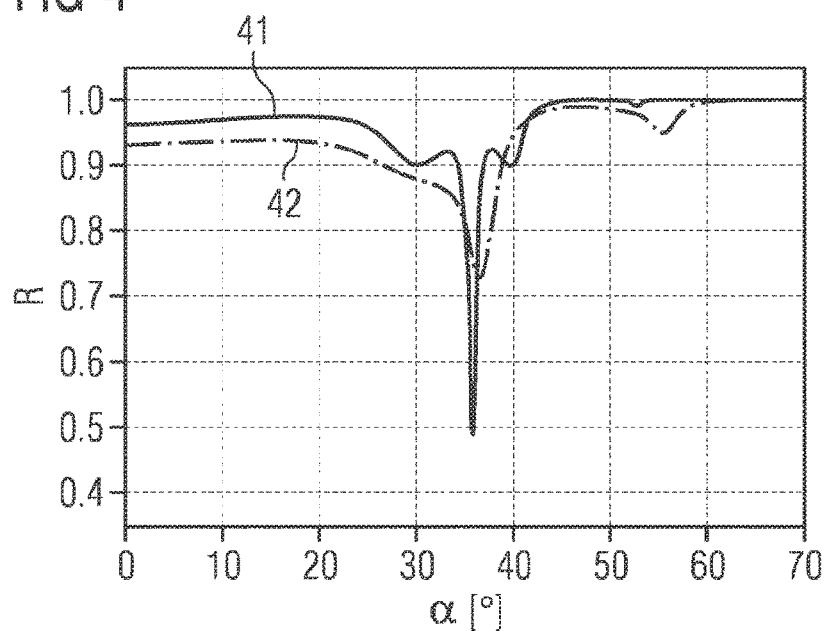
FIG. 4 is a graphical representation of the reflection of the reflection-enhancing dielectric layer sequence and of the comparative example according to FIGS. 3A and 3B, FIGS. 5A and 5B are schematic representations of an embodiment of the reflection-enhancing dielectric layer sequence and of a comparative example with an Rh connection layer.

FIG. 4 shows the reflection coefficients R of the layer sequence according to the embodiment of FIG. 3A (curve 41) and of the comparative example of FIG. 3B (curve 42) as a function of the angle of incidence α for blue light with a wavelength of 450 nm. The reflection coefficients R are averaged for TE and TM polarized light. It is clear that the layer sequence according to the embodiment has a higher reflection coefficient over virtually the entire angular range than the layer sequence according to the comparative example, which does not contain a reflection-enhancing dielectric layer sequence.

Figure 5A:
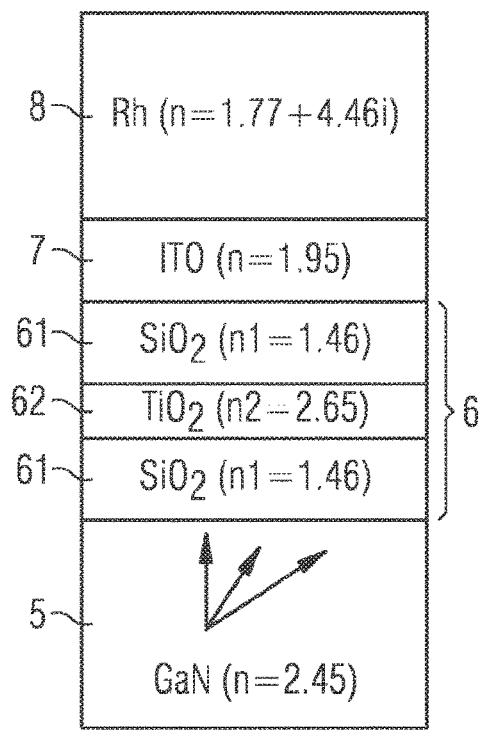
Figure 5B:
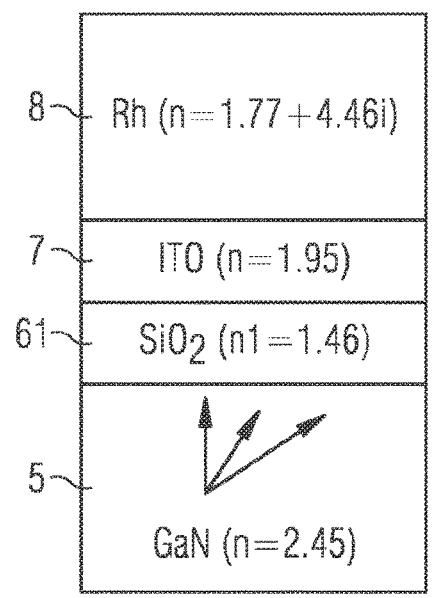

FIGS. 5A and 5B show a modification of the embodiment of the layer sequence according to FIG. 3A and of the comparative example according to FIG. 3B, wherein the difference is that the metal rhodium (Rh) is used instead of aluminum as the material for the metallic first electrical connection layer 8. Otherwise, the layer sequences correspond to those of FIG. 3A and FIG. 3B respectively.

Figure 6:
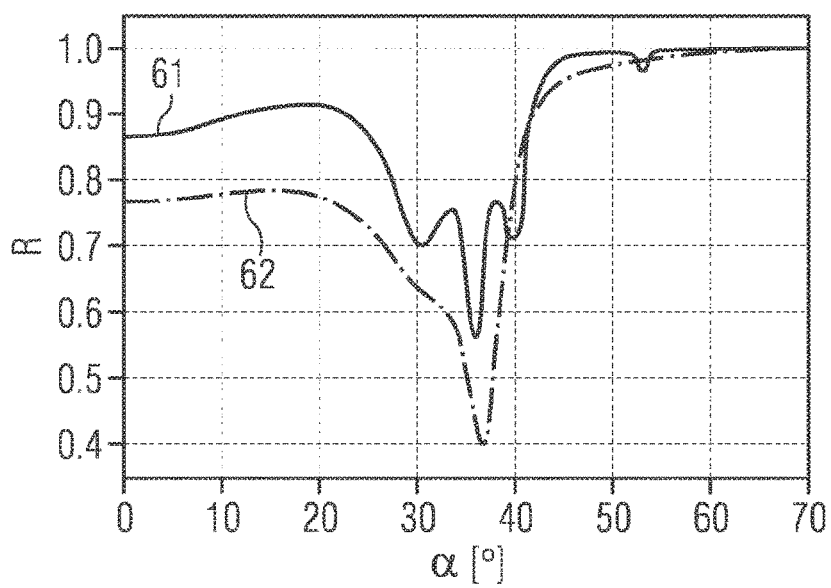
FIG. 6 is a graphical representation of the reflection of the reflection-enhancing dielectric layer sequence and of the comparative example according to FIGS. 5A and 5B, FIGS. 7 to 13 are each schematic representations of a cross-section through an optoelectronic semiconductor chip according to a further embodiment.

FIG. 6 shows the reflection coefficients R of the layer sequence according to the embodiment of FIG. 5A (curve 61) and of the comparative example of FIG. 5B (curve 62) as a function of the angle of incidence α for blue light with a wavelength of 450 nm. The reflection coefficients are averaged for TE and TM polarized light. In the embodiment, the reflection-enhancing dielectric layer sequence results in a marked increase in the reflection coefficient R relative to the comparative example over virtually the entire angular range. When using rhodium as the metal for the first electrical connection layer, the effect is even more marked than when using aluminum, since rhodium has a lower reflection coefficient and thus a stronger absorption.

FIG. 7 shows a further embodiment of the optoelectronic semiconductor chip 10. This differs from the embodiment shown in FIG. 1 in that the reflection-enhancing dielectric layer sequence 6 was not applied over the entire surface and subsequently photolithographically patterned but rather was applied with patterning using a lift-off process. In a method for producing the optoelectronic semiconductor chip 10, the reflection-enhancing dielectric layer sequence 6 is for example deposited in a previously photolithographically defined window in a mask layer and then the material of the reflection-enhancing dielectric layer sequence 6 outside the window is lifted off with the mask layer. As a result of growth in the mask layer window, the reflection-enhancing dielectric layer sequence 6, once completed, includes gently outwardly sloping flanks. In this configuration, the layer thicknesses of the individual layers of the reflection-enhancing dielectric layer sequence 6 may in particular decrease at least slightly from the center outwards. This may be determined by shading effects during growth of the reflection-enhancing dielectric layer sequence 6 at the edges defined by the mask layer.

FIG. 8 shows a further embodiment of the optoelectronic semiconductor chip 10. This embodiment differs from the embodiment illustrated in FIG. 1 in that a second transparent electrically conductive layer 11 is arranged between the n-doped semiconductor layer 3 and the second metallic connection layer 9. The second transparent electrically conductive layer 11 advantageously contains a transparent conductive oxide such as for example ITO. The transparent electrically conductive layer 11 advantageously brings about current spreading, such that the width of the second electrical connection layer 9 may advantageously be reduced. In this way, absorption losses in the second electrical connection layer 9 are reduced.

Figure 9:
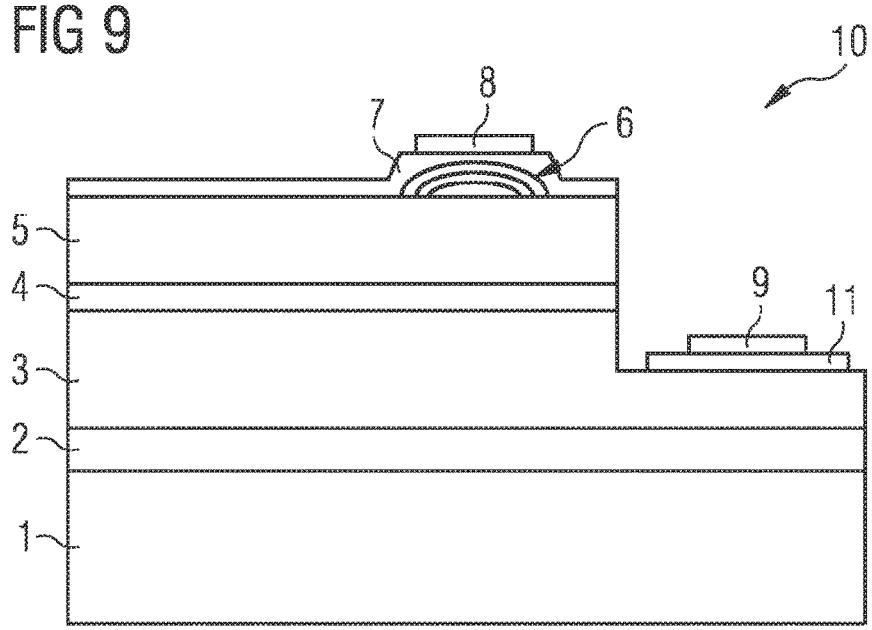

The embodiment illustrated in FIG. 9 differs from the embodiment shown in FIG. 8 in that the reflection-enhancing dielectric layer sequence 6 is produced as in the embodiment of FIG. 7 using a lift-off method and thus includes flanks sloping gently outwards.

Figure 10:
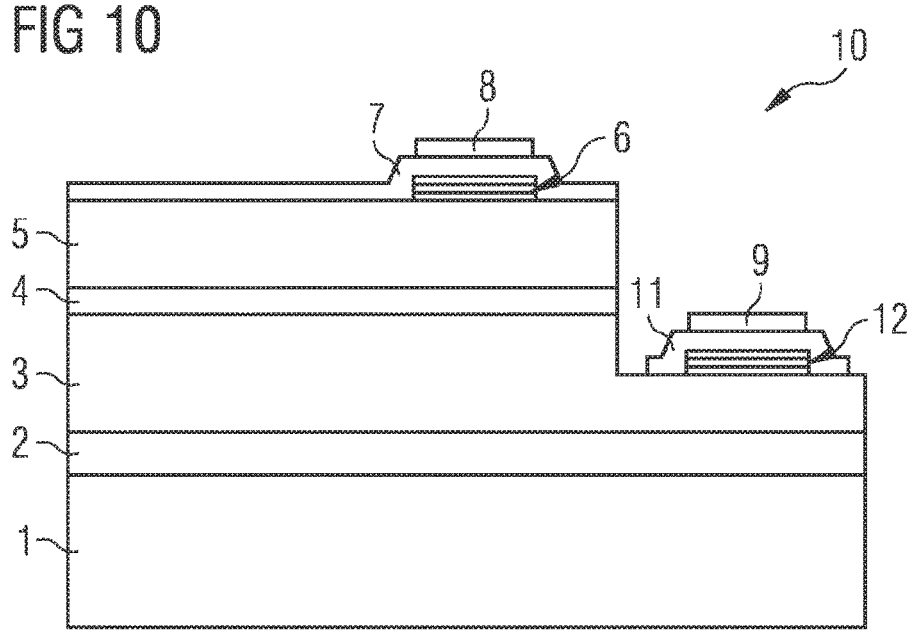

The embodiment of FIG. 10 differs from the embodiment shown in FIG. 8 in that a second reflection-enhancing dielectric layer sequence 12 is also arranged between the n-doped semiconductor layer 3 and the second electrical connection layer 9. The second reflection-enhancing dielectric layer sequence 12 may have the same advantageous configurations as the reflection-enhancing dielectric layer sequence 6 between the p-doped semiconductor layer 5 and the first electrical connection layer 8. The second reflection-enhancing dielectric layer sequence 12 also corresponds to the above-described reflection-enhancing dielectric layer sequence 6 beneath the first electrical connection layer 8 in terms of its function and mode of operation. In the embodiment of FIG. 10, the reflection-enhancing dielectric layer sequences 6, 12 have each been patterned photolithographically using an etching process and therefore have sharply defined side flanks.

Figure 11:
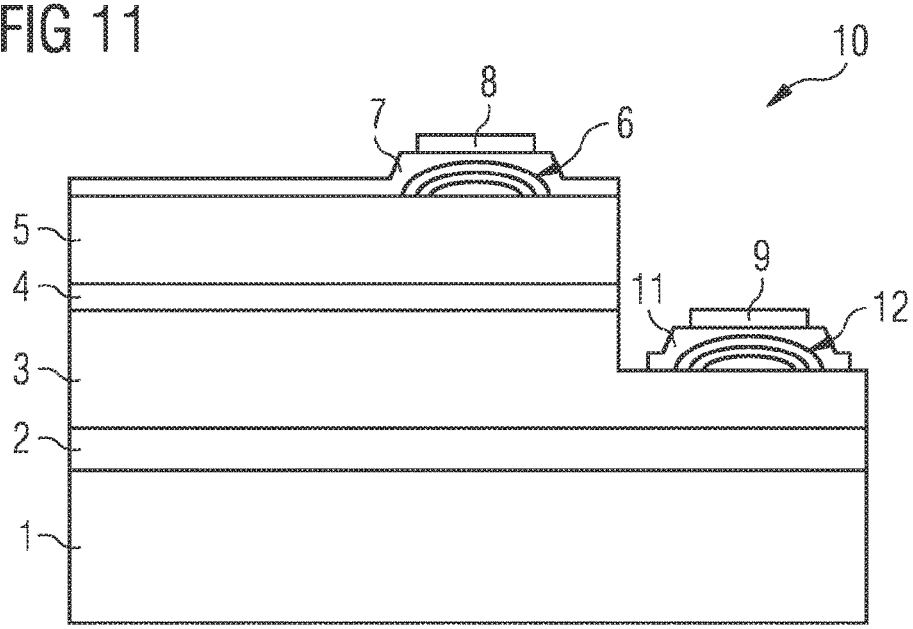

The embodiment of FIG. 11 differs from the embodiment of FIG. 10 in that the two reflection-enhancing dielectric layer sequences 6, 12 have each been patterned using a lift-off method and therefore, like the reflection-enhancing dielectric layer sequences in the embodiments of FIGS. 6 and 8, each have gently outwardly sloping flanks.

Figure 12:
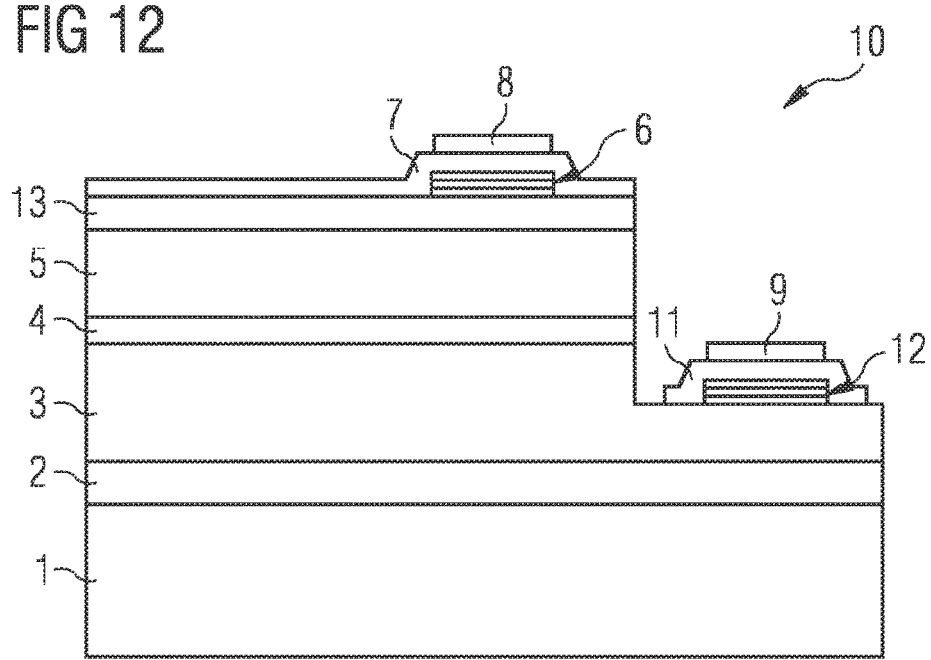

FIG. 12 shows a further embodiment of an optoelectronic semiconductor chip 10, in which a transparent electrically conductive interlayer 13 is arranged between the p-doped semiconductor layer 5 and the reflection-enhancing dielectric layer sequence 6. The transparent electrically conductive interlayer 13 advantageously includes a transparent conductive oxide such as for example ITO. In particular, the transparent electrically conductive interlayer is formed from the same material as the transparent conductive layer 7. The transparent electrically conductive interlayer 13 may in particular cover the entire surface of the p-doped semiconductor layer 5. The thickness of the transparent electrically conductive interlayer 13 may for example amount to around 15 nm to 20 nm.

In this configuration, current flows from the first connection layer 8 via the transparent electrically conductive layer 7 and the transparent electrically conductive interlayer 13 to the p-doped semiconductor layer 5. This embodiment has the advantage that the entire p-doped semiconductor layer 5 is electrically contacted. In this case, electromagnetic radiation is generated in the entire active layer 4, wherein absorption of the radiation generated below the first connection layer 8 is reduced by the reflection-enhancing dielectric layer sequence 6.

Likewise, a second electrically conductive transparent interlayer (not shown) may also be inserted between the n-doped semiconductor layer 3 and the second reflection-enhancing dielectric layer sequence 12.

Figure 13:
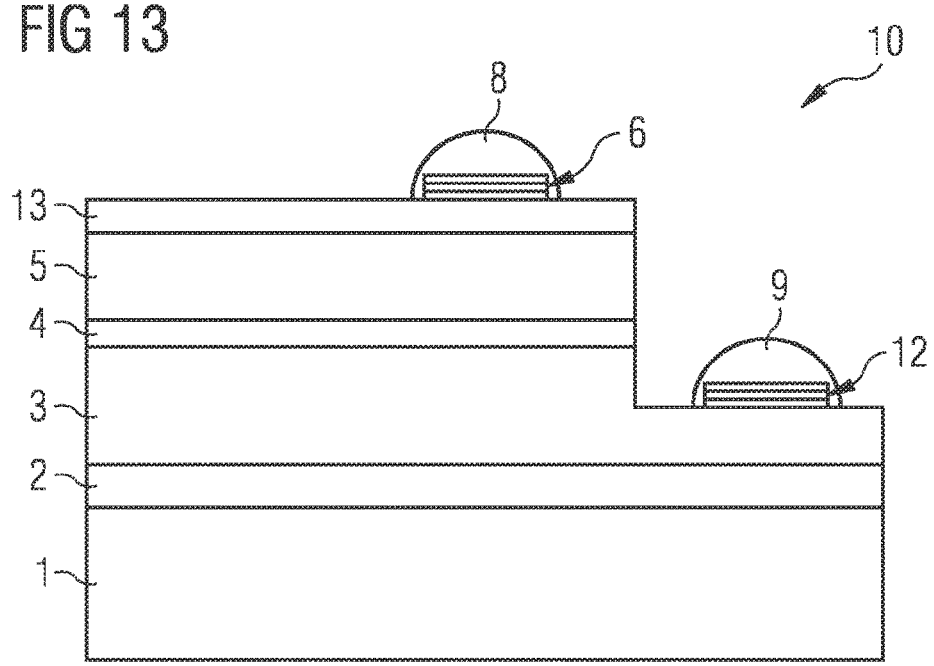

FIG. 13 shows a further embodiment of the optoelectronic semiconductor chip 10 in which, as in the embodiment of FIG. 12, a transparent electrically conductive interlayer 13 is arranged between the p-doped semiconductor layer 5 and the reflection-enhancing dielectric layer sequence 6. This embodiment differs from the previous embodiments in particular in that no transparent electrically conductive layer is arranged between the reflection-enhancing dielectric layer sequence 6 and the first connection layer 8. Electrical contact between the first connection layer 8 and the transparent electrically conductive interlayer 13 arranged beneath the reflection-enhancing dielectric layer sequence 6 is produced in that the first connection layer 8 encases the reflection-enhancing dielectric layer sequence 6. In particular, the reflection-enhancing dielectric layer sequence 6 is encased by the first connection layer 8 in such a way that the latter completely covers the surface and the side flanks and in part adjoins the transparent conductive interlayer 13 laterally of the reflection-enhancing dielectric layer sequence.

As in the embodiment of FIG. 12, the p-doped semiconductor layer 5 is advantageously covered over its entire surface by the transparent electrically conductive interlayer 13, such that current may flow through the active layer 4 over its entire width. Absorption of the radiation generated directly below the first connection layer 8 is very extensively reduced by the reflection-enhancing dielectric layer sequence 6. Absorption takes place substantially only in the side regions of the first electrical connection layer 8, which directly adjoin the transparent electrically conductive interlayer next to the side flanks of the reflection-enhancing dielectric layer sequence. The first electrical connection layer 8 advantageously does not project laterally beyond the reflection-enhancing dielectric layer sequence 6 by any more than 10 µm and particularly advantageously not by any more than 5 µm.

In the embodiment of FIG. 13, the n-doped semiconductor layer 3 is electrically contacted in that the second connection layer 9 encases the second reflection-enhancing dielectric layer sequence 12 and thereby in part directly adjoins the n-doped semiconductor layer 3. In the embodiment, no transparent electrically conductive interlayer is arranged between the n-doped semiconductor layer 3 and the second reflection-enhancing dielectric layer sequence 12. However, as with the first connection layer, a second transparent electrically conductive interlayer could be arranged between the n-doped semiconductor layer 3 and the second reflection-enhancing dielectric layer sequence 12.

The various options described in connection with the embodiments for electrical contacting of the p-doped semiconductor layer or of the n-doped semiconductor layer using at least one reflection-enhancing dielectric layer sequence to reduce absorption in the first and/or second electrical connection layer may be combined together in various ways, even if this combination is not explicitly depicted in one of the embodiments.

The present disclosure is not restricted by the description given with reference to the embodiments. Rather, the present disclosure encompasses any novel feature and any combination of features, including in particular any combination of features in the claims, even if this feature or this combination is not itself explicitly indicated in the claims or embodiments.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. Optoelectronic semiconductor chip, comprising at least one n-doped semiconductor layer, at least one p-doped semiconductor layer and one active layer arranged between the at least one n-doped semiconductor layer and the at least one p-doped semiconductor layer,
    wherein the p-doped semiconductor layer is electrically contacted by means of a first metallic connection layer, and wherein a reflection-enhancing dielectric layer sequence is arranged between the p-doped semiconductor layer and the first connection layer, which reflection-enhancing dielectric layer sequence comprises a plurality of dielectric layers with different refractive indices,
    wherein the reflection-enhancing dielectric layer sequence comprises at least three layers, which comprise at least one first dielectric layer with a thickness of d1 of a first dielectric material with a refractive index n1 and at least one second dielectric layer with a thickness of d2 of a second dielectric material with a refractive index n2>n1, and
    wherein the active layer is suitable for emitting radiation with a dominant wavelength $\lambda$, wherein $0.01\lambda/4 \leq n1*d1 \leq 10\lambda/4$ applies for the thickness d1 of the at least one first dielectric layer and $0.01\lambda/4 \leq n2*d2 \leq 10\lambda/4$ applies for the thickness d2 of the at least one second dielectric layer.

2. Optoelectronic semiconductor chip according to claim 1, wherein a transparent electrically conductive layer is arranged between the p-doped semiconductor layer and the first connection layer, wherein the transparent electrically conductive layer is arranged at least in places between the reflection-enhancing dielectric layer sequence and the first connection layer.

3. Optoelectronic semiconductor chip according to claim 1, wherein $0.7\lambda/4 \leq n1*d1 \leq 1.3\lambda/4$ applies for the thickness d1 of the at least one first dielectric layer and $0.7\lambda/4 \leq n2*d2 \leq 1.3\lambda/4$ applies for the thickness d2 of the at least one second dielectric layer.

4. Optoelectronic semiconductor chip according to claim 1, wherein the reflection-enhancing dielectric layer sequence comprises at least one of the materials $Al_2O_3$, $Ta_2O_5$, $ZrO_2$, ZnO, $SiN_x$, $SiO_xN_y$, $SiO_2$, $TiO_2$, $ZrO_2$, $HfO_2$, $Nd_2O_5$ or $MgF_2$.

5. Optoelectronic semiconductor chip according to claim 1, wherein the first connection layer encases the reflection-enhancing dielectric layer sequence.

6. Optoelectronic semiconductor chip according to claim 1, wherein the at least one n-doped semiconductor layer, the at least one p-doped semiconductor layer and the active layer each comprise a nitride compound semiconductor material.

7. Optoelectronic semiconductor chip according to claim 1, wherein a transparent electrically conductive interlayer is arranged between the p-doped semiconductor layer and the reflection-enhancing dielectric layer sequence.

8. Optoelectronic semiconductor chip according to claim 7, wherein the transparent electrically conductive interlayer covers an entire surface of the p-doped semiconductor layer.

9. Optoelectronic semiconductor chip according to claim 1, wherein the reflection-enhancing dielectric layer sequence comprises a plurality of pairs of layers, which each comprise a first dielectric layer of a first dielectric material with a refractive index n1 and at least one second dielectric layer of a second dielectric material with a refractive index n2>n1.

10. Optoelectronic semiconductor chip according to claim 9, wherein the active layer is suitable for emitting radiation with a dominant wavelength $\lambda$, wherein $0.01\lambda/4 \leq n1*d1 \leq 10\lambda/4$ applies for the thickness d1 of the at least one first dielectric layer and $0.01\lambda/4 \leq n2*d2 \leq 10\lambda/4$ applies for the thickness d2 of the at least one second dielectric layer.

11. Optoelectronic semiconductor chip according to claim 1, wherein the at least one n-doped semiconductor layer is electrically contacted by means of a second metallic connection layer.

12. Optoelectronic semiconductor chip according to claim 11, wherein at least one second transparent electrically conductive layer is arranged between the n-doped semiconductor layer and the second metallic connection layer.

13. Optoelectronic semiconductor chip according to claim 11, wherein the first metallic connection layer and/or the second metallic connection layer comprise at least one of the metals Au, Ag, Ti, Pt, Pd, Cu, Ni, In, Rh, Cr, Al or W.

14. Optoelectronic semiconductor chip according to claim 11, wherein a second reflection-enhancing dielectric layer sequence is arranged between the n-doped semiconductor layer and the second metallic connection layer, wherein the second reflection-enhancing dielectric layer sequence comprises a plurality of dielectric layers with different refractive indices.

15. Optoelectronic semiconductor chip according to claim 14, wherein the second connection layer encases the second reflection-enhancing dielectric layer sequence.

16. Optoelectronic semiconductor chip, comprising at least one n-doped semiconductor layer, at least one p-doped semiconductor layer and one active layer arranged between the at least one n-doped semiconductor layer and the at least one p-doped semiconductor layer,
    wherein the p-doped semiconductor layer is electrically contacted by means of a first metallic connection layer, and wherein a reflection-enhancing dielectric layer sequence is arranged between the p-doped semiconductor layer and the first connection layer, which reflection-enhancing dielectric layer sequence comprises a plurality of dielectric layers with different refractive indices, wherein a transparent electrically conductive interlayer is arranged between the p-doped semiconductor layer and the reflection-enhancing dielectric layer sequence, wherein electrical contact between the first connection layer and the transparent electrically conductive interlayer is produced in that the first connection layer encases the reflection-enhancing dielectric layer sequence, and wherein the n-doped semiconductor layer is electrically contacted in that the second connection layer in part directly adjoins the n-doped semiconductor layer, wherein the reflection-enhancing dielectric layer sequence comprises at least three layers, which comprise at least one first dielectric layer with a thickness d1 of a first dielectric material with a refractive index n1 and at least one second dielectric layer with a thickness d2 of a second dielectric material with a refractive index n2>n1, and wherein the active layer is suitable for emitting radiation with a dominant wavelength $\lambda$, wherein $0.01\lambda/4 \leq n1*d1 \leq 10\lambda/4$ applies for the thickness d1 of the at least one first dielectric layer and $0.01\lambda/4 \leq n2*d2 \leq 10\lambda/4$ applies for the thickness d2 of the at least one second dielectric layer.

17. Optoelectronic semiconductor chip, comprising at least one n-doped semiconductor layer, at least one p-doped semiconductor layer and one active layer arranged between the at least one n-doped semiconductor layer and the at least one p-doped semiconductor layer, wherein the p-doped semiconductor layer is electrically contacted by means of a first metallic connection layer, and wherein a reflection-enhancing dielectric layer sequence is arranged between the p-doped semiconductor layer and the first connection layer, which reflection-enhancing dielectric layer sequence comprises a plurality of dielectric layers with different refractive indices, wherein a transparent electrically conductive layer is arranged between the first connection layer and the reflection-enhancing dielectric layer sequence, and a transparent electrically conductive interlayer is arranged between the p-doped semiconductor layer and the reflection-enhancing dielectric layer sequence, wherein the reflection-enhancing dielectric layer sequence comprises at least three layers, which comprise at least one first dielectric layer with a thickness d1 of a first dielectric material with a refractive index n1 and at least one second dielectric layer with a thickness of d2 of a second dielectric material with a refractive index n2>n1, and wherein the active layer is suitable for emitting radiation with a dominant wavelength $\lambda$, wherein $0.01\lambda/4 \leq n1*d1 \leq 10\lambda/4$ applies for the thickness d1 of the at least one first dielectric layer and $0.01\lambda/4 \leq n2*d2 \leq 10\lambda/4$ applies for the thickness d2 of the at least one second dielectric layer.

* * * * *